(12) United States Patent
Hu et al.

(10) Patent No.: US 11,551,848 B2
(45) Date of Patent: Jan. 10, 2023

(54) PLANAR TRANSFORMER AND SWITCHING POWER ADAPTER

(71) Applicant: Huawei Digital Power Technologies Co., Ltd., Shenzhen (CN)

(72) Inventors: Yanjun Hu, Shenzhen (CN); Zunqing Miao, Dongguan (CN); Chunfu Wang, Shenzhen (CN); Weiyang Zhao, Dongguan (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 272 days.

(21) Appl. No.: 16/867,775

(22) Filed: May 6, 2020

(65) Prior Publication Data

US 2020/0265987 A1    Aug. 20, 2020

Related U.S. Application Data

(63) Continuation of application No. PCT/CN2018/113988, filed on Nov. 5, 2018.

(30) Foreign Application Priority Data

Nov. 9, 2017    (CN) .......................... 201711097615.0

(51) Int. Cl.
*H01F 27/02* (2006.01)
*H01F 27/245* (2006.01)
(Continued)

(52) U.S. Cl.
CPC ........... *H01F 27/02* (2013.01); *H01F 27/245* (2013.01); *H01F 27/2804* (2013.01);
(Continued)

(58) Field of Classification Search
CPC ............... H01F 27/2804; H01F 27/245; H01F 27/2866; H01F 2027/2819; H05K 1/0298; H05K 3/328
See application file for complete search history.

(56) References Cited

U.S. PATENT DOCUMENTS 6,501,364 B1 * 12/2002 Hui ........................ H01F 27/361
336/200
10,468,181 B1 * 11/2019 Vinciarelli ............ H01F 41/046
(Continued)

FOREIGN PATENT DOCUMENTS

CN    1949417 A    4/2007
CN    200953366 Y    9/2007
(Continued)

*Primary Examiner* — Jeffrey T Carley
(74) *Attorney, Agent, or Firm* — Rimon PC

(57) ABSTRACT

This application provides a planar transformer and a switching power adapter. The planar transformer includes a PCB winding and two magnetic cores. The two magnetic cores wrap two sides of a winding body of the PCB winding to form a closed magnetic loop. A first group of welding points is disposed on a primary-side wire side of the PCB winding, and a second group of welding points is disposed on a secondary-side wire side of the PCB winding. The planar transformer is directly welded to an external circuit board by using the first group of welding points and the second group of welding points. In this way, no pin needs to be welded on the PCB winding board. In addition, the planar transformer can be vertically installed on the external circuit board by using the first group of welding points and the second group of welding points.

9 Claims, 5 Drawing Sheets

(51) Int. Cl.
*H01F 27/28* (2006.01)
*H05K 1/02* (2006.01)
*H05K 3/32* (2006.01)
*H02M 1/00* (2006.01)

(52) U.S. Cl.
CPC ....... *H01F 27/2866* (2013.01); *H05K 1/0298* (2013.01); *H05K 3/328* (2013.01); *H01F 2027/2819* (2013.01); *H02M 1/00* (2013.01)

(56) References Cited

U.S. PATENT DOCUMENTS

| | | | | |
|---|---|---|---|---|
| 2003/0095027 | A1* | 5/2003 | Shu Yuen Hui | H01F 27/361 336/200 |
| 2004/0032313 | A1* | 2/2004 | Ferencz | H01F 27/266 336/200 |
| 2008/0231403 | A1* | 9/2008 | Hsu | H01F 27/2804 336/200 |
| 2011/0241816 | A1* | 10/2011 | Park | H01F 41/34 336/200 |
| 2011/0310579 | A1* | 12/2011 | Smeys | H01L 23/5227 336/83 |
| 2016/0086718 | A1* | 3/2016 | Tsai | H01F 27/2804 336/221 |
| 2018/0197669 | A1* | 7/2018 | Cioffi | H01F 27/306 |

FOREIGN PATENT DOCUMENTS

| | | | | |
|---|---|---|---|---|
| CN | 201084533 | Y | | 7/2008 |
| CN | 201478089 | U | | 5/2010 |
| CN | 201489982 | U | | 5/2010 |
| CN | 102842408 | A | | 12/2012 |
| CN | 204230005 | U | | 3/2015 |
| CN | 105914011 | A | * | 8/2016 ............ H01F 27/24 |
| CN | 206282700 | U | | 6/2017 |
| CN | 206293235 | U | | 6/2017 |
| CN | 206388585 | U | | 8/2017 |
| CN | 107808756 | A | | 3/2018 |
| DE | 102013113861 | A1 | | 6/2015 |
| EP | 2682958 | A1 | * | 1/2014 ........ H01F 27/2804 |
| JP | H08236365 | A | | 9/1996 |
| RO | 131757 | | | 3/2017 |

* cited by examiner

PLANAR TRANSFORMER AND SWITCHING POWER ADAPTER

CROSS-REFERENCE TO RELATED APPLICATIONS

This application is a continuation of International Application No. PCT/CN2018/113988, filed on Nov. 5, 2018, which claims priority to Chinese Patent Application No. 201711097615.0, filed on Nov. 9, 2017. The disclosures of the aforementioned applications are hereby incorporated by reference in their entireties.

TECHNICAL FIELD

The present invention relates generally to the field of transformer technologies, and more specifically, to planar transformers and switching power adapters that use planar transformers.

BACKGROUND

A switching power adapter converts an alternating current into a low-voltage direct current and supplies the direct current to a rechargeable battery in a terminal (for example, a mobile phone, a tablet computer, or a camera), to charge the rechargeable battery.

A planar transformer (or a flat transformer) is a core component for power conversion. A planar transformer uses a small-sized E-type, RM-type, or ring-type ferrite magnetic core and is usually made of a high-frequency power ferrite material. A planar transformer has a relatively low magnetic core loss at high frequencies. To form a magnetic loop of a transformer, a winding is formed through lap winding of a multilayer printed circuit board, and the winding or a copper sheet is lapped on a high-frequency iron core on a plane. A planar transformer has the advantages of low electromagnetic interference (EMI) radiation and small size.

Each planar transformer used in current switching power adapters has a horizontal structure shown in FIG. 1. The planar transformer in FIG. 1 includes a magnetic core 1, a printed circuit board (PCB) 2, and a pin 3 that is welded to the PCB 2, where the PCB is a winding of the transformer. The PCB 2 is connected to a power board in a switching power adapter through the pin 3. The procedure of welding the pin to the PCB is quite complex and the processing costs are high. In addition, the planar transformer of this kind of horizontal structure occupies a large area of the power board, resulting in low space utilization in switching power adapter.

SUMMARY

In view of the above described problems, this application provides a planar transformer and a switching power adapter, to solve the technical problem that a current planar transformer uses a complex processing procedure and has high costs.

According to a first aspect, this application provides a planar transformer, including a printed circuit board PCB winding, an insulating cover, a first magnetic core, and a second magnetic core. The PCB winding includes a winding body, a primary-side wire, and a secondary-side wire. The winding body includes a primary-side winding and a secondary-side winding. The primary-side wire is a lead wire of the primary-side winding, the secondary-side wire is a lead wire of the secondary-side winding, and there is a preset insulation distance between the primary-side winding and the secondary-side wire. A first group of welding points electrically communicating with the primary-side winding is disposed at an end of the primary-side wire, a second group of welding points electrically communicating with the secondary-side winding is disposed at an end of the secondary-side wire, and the first group of welding points and the second group of welding points are connected to an external circuit. The first magnetic core and the second magnetic core wrap two sides of the winding body to form a closed magnetic loop. The insulating cover wraps outside the first magnetic core, the second magnetic core, and the secondary-side wire.

According to the planar transformer provided in this embodiment, the first group of welding points is disposed at the end of the primary-side wire, and the second group of welding points is disposed at the end of the secondary-side wire. The planar transformer is welded to a circuit board by using the first group of welding points and the second group of welding points. In this way, no pin needs to be welded on the PCB winding board. Therefore, a processing procedure for the planar transformer is simplified, full automatic processing can be implemented, processing time and costs are reduced, and processing efficiency is improved. In addition, the planar transformer can be vertically installed on the external circuit board by using the first group of welding points and the second group of welding points. Compared with a horizontal planar transformer, in the vertical installation mode, required space occupied on the external circuit board is reduced, thereby improving space utilization of the circuit board. In addition, due to a configuration of the insulating cover, an insulation distance between a primary side and a low voltage component outside the planar transformer can be increased, improving security performance of the planar transformer.

In a possible implementation of the first aspect, a U-shaped groove is disposed between the winding body and the secondary-side wire to increase an insulation distance between the secondary-side wire and each of the first magnetic core, the second magnetic core, and the primary-side winding. In this way, the security performance of the planar transformer is improved.

In another possible implementation of the first aspect, an insulating sheet is disposed inside the insulating cover, and a thickness of the insulating sheet matches a width of the U-shaped groove. After the insulating cover is assembled, the insulating sheet fits in the U-shaped groove to enlarge an electrical gap between the primary-side winding and the secondary-side wire, further improving the security performance of the planar transformer.

In still another possible implementation of the first aspect, a through hole is disposed in a plane on which the winding body is located. Bosses whose shapes match a shape of the through hole are disposed on sides, facing the winding body, of the first magnetic core and the second magnetic core, and the bosses of the first magnetic core and the second magnetic core align with each other and there is a preset air gap between the bosses, so as to prevent the planar transformer from being saturated. Two side columns are disposed on each of sides, facing the PCB winding, of the first magnetic core and the second magnetic core, and the first magnetic core is in contact with the second magnetic core in a closed manner through the side columns.

In yet another possible implementation of the first aspect, on a surface, of the PCB winding, lengths of sides on which the primary-side wire and the secondary-side wire are located each are greater than a length of the PCB winding body. In other words, two ends of the PCB winding are of protrusion shapes, so as to protect the magnetic cores from being struck and cracked.

In another possible implementation of the first aspect, the first magnetic core or the second magnetic core is fixedly connected to the PCB winding by using bonding adhesive. Side columns of the second magnetic core are fixedly connected to those of the first magnetic core by using bonding adhesive. The bonding adhesive is used for fixed connection, and therefore a processing process is simple and efficient.

In still another possible implementation of the first aspect, the first magnetic core is electrically connected to a ground point of the PCB winding by using conductive adhesive. The conductive adhesive is used for fixed connection, and therefore a processing process is simple and efficient.

In yet another possible implementation of the first aspect, the PCB winding is a single multilayer PCB, there is an insulating medium between any two PCB layers of the single multilayer PCB, and any PCB layer is a primary-side winding or a secondary-side winding.

According to a second aspect, this application further provides a switching power adapter, including a power board and the planner transformer according to any possible implementation of the first aspect. A first group of welding points and a second group of welding points of the planar transformer are directly welded on the power board, and a surface, having the largest area, of the planar transformer is installed perpendicular to the power board. In this way, a contact surface between the planar transformer and the power board is far smaller than the surface, having the largest area, of the planar transformer, reducing space occupied by the planar transformer on the power board, improving space utilization of the power board, thereby reducing a size of the switching power adapter.

The planar transformer provided in this application includes the PCB winding and the two magnetic cores. The two magnetic cores wrap two sides of the winding body of the PCB winding to form a closed magnetic loop. The first group of welding points is disposed on a primary-side wire side of the PCB winding, and the second group of welding points is disposed on a secondary-side wire side of the PCB winding. The planar transformer is directly welded to an external circuit board by using the first group of welding points and the second group of welding points. In this way, no pin needs to be welded on the PCB winding board. Therefore, a processing procedure for the planar transformer is simplified, full automatic processing is implemented, processing time and costs are reduced, and processing efficiency is improved. In addition, the planar transformer can be vertically installed on the external circuit board by using the first group of welding points and the second group of welding points. Compared with a horizontal planar transformer, in the vertical installation mode, required space occupied on the external circuit board is reduced, thereby improving space utilization of the external circuit board.

DESCRIPTION OF EMBODIMENTS

To solve the foregoing problem, this application provides a planar transformer. In the planar transformer, a first group of welding points is directly disposed on a primary-side wire of a PCB winding, and a second group of welding points is disposed on a secondary-side wire. The planar transformer is directly welded to a power board inside a switching power adapter by using the first group of welding points and the second group of welding points. In this way, no pin needs to be welded on the PCB winding. Therefore, a processing procedure for the planar transformer is simplified, full automatic processing is implemented, processing time and costs are reduced, and processing efficiency is improved. In addition, when the planar transformer is applied inside the switching power adapter, the planar transformer can be vertically installed on the power board inside the switching power adapter by using the first group of welding points and the second group of welding points. In other words, a surface, having the largest area, of the planar transformer is perpendicular to the power board. A contact surface between the planar transformer and the power board is far smaller than the surface having the largest area. Therefore, the planar transformer can be vertically installed, reducing space occupied on the power board and improving space utilization of the power board.

Figure 2:
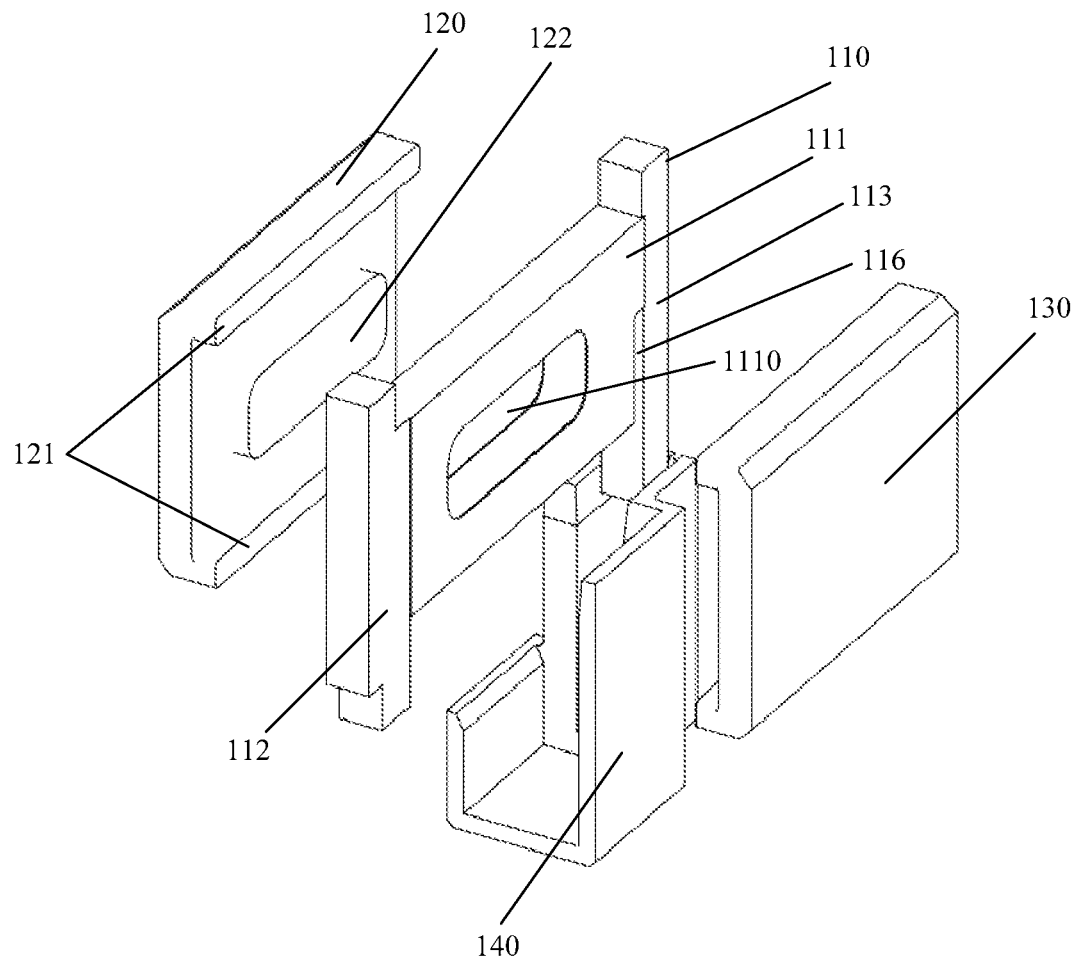
FIG. 2 is an exploded view of a planar transformer according to an embodiment of this application.
Figure 3:
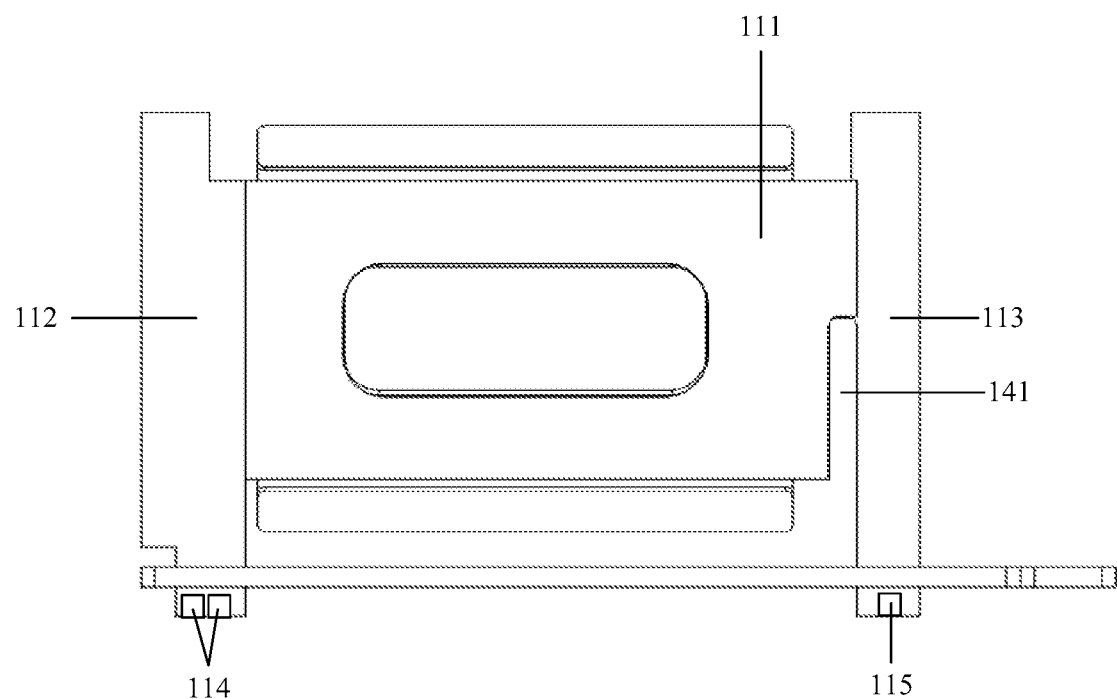
FIG. 3 is a longitudinal section view of a planar transformer according to an embodiment of this application.
Figure 4:
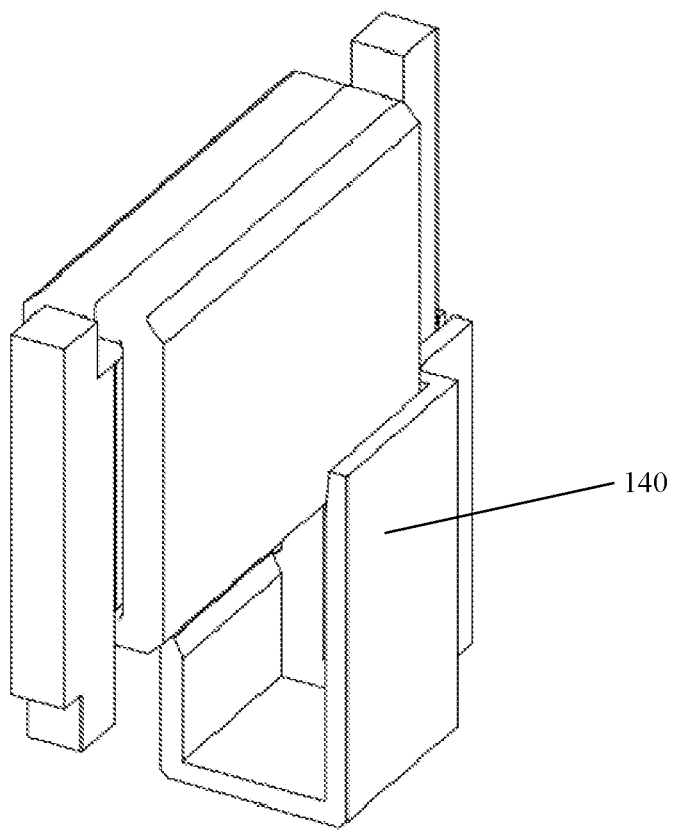
FIG. 4 is a schematic assembly effect diagram of a planar transformer according to an embodiment of this application.
Figure 5:
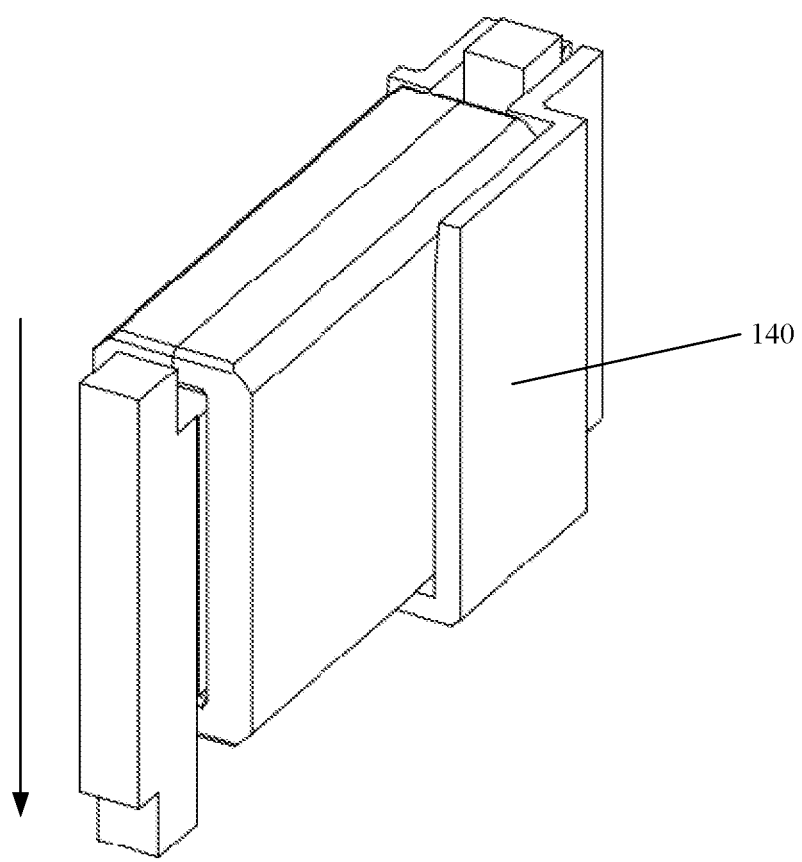
FIG. 5 is another schematic assembly effect diagram of a planar transformer according to an embodiment of this application.

Refer to FIG. 2 to FIG. 5. FIG. 2 is a schematic exploded view of a planar transformer according to an embodiment of this application. FIG. 3 is a schematic longitudinal sectional view of a planar transformer according to an embodiment of this application. FIG. 4 is a schematic assembly effect diagram of a planar transformer according to an embodiment of this application. FIG. 5 is another schematic assembly effect diagram of a planar transformer according to an embodiment of this application.

As shown in FIG. 2, the planar transformer includes a PCB winding 110, a first magnetic core 120, a second magnetic core 130, and an insulating cover 140. The first magnetic core 120 and the second magnetic core 130 wrap two sides of the PCB winding 110 to form a closed magnetic loop.

A middle part of the PCB winding 110 is a winding body 111, and a through hole 1110 is disposed in the middle of the winding body.

A primary-side wire 112 and a secondary-side wire 113 are disposed on two sides of the winding body 111. The winding body 111 includes a primary-side winding and a secondary-side winding. The primary-side wire is a lead wire of the primary-side winding and the secondary-side wire is a lead wire of the secondary-side winding.

An outer side of the first magnetic core 120 is a plane. Two side columns 121 are disposed on an inner side, facing the PCB winding 110, of the first magnetic core 120. In addition, a boss 122 is disposed in a middle part of the inner side of the first magnetic core 120, and a size of the boss matches a size of the through hole in the winding body 111. Similarly, an outer side of the second magnetic core 130 is a plane. Two side columns are disposed on an inner side of the second magnetic core 130, and a boss is disposed in a middle part of the inner side.

During assembly of the planar transformer, the boss of the first magnetic core 120 is inserted into the through hole of the PCB winding 110, and then the boss of the second magnetic core 130 is inserted into the through hole from the other side of the PCB winding 110. The bosses of the first magnetic core 120 and the second magnetic core 130 are aligned with each other in the through hole of the PCB winding 110, and there is a specific air gap between the two bosses to prevent the transformer from being saturated. In addition, the two side columns of the first magnetic core 120 are in contact with the two side columns of the second magnetic core 130 in a closed manner. In this way, the first magnetic core 120 and the second magnetic core 130 form a closed magnetic loop through closed contact between the side columns and the bosses.

As shown in FIG. 2, on the PCB winding, a U-shaped groove 116 is disposed between the winding body 111 and the secondary-side wire 113, so that there is a specific creepage distance between a primary side (to be specific, the primary-side winding and the magnetic cores) and the secondary-side wire.

As shown in FIG. 4, the insulating cover 140 wraps outside the magnetic cores and the secondary-side wire 113, to ensure insulation between the primary-side winding and a secondary-side component on an external circuit board of the planar transformer. In addition, an insulating sheet matching the U-shaped groove 116 is disposed inside the insulating cover 140. After the insulating cover is assembled, the insulating sheet 141 (as shown in FIG. 3) is inserted into the U-shaped groove, to meet a requirement of enhancing insulation between the primary side and the secondary-side wire of the planar transformer.

As shown in FIG. 3, a first group of welding points 114 is disposed at an end of the primary-side wire 112, and a second group of welding points 115 is disposed at an end of the secondary-side wire 113. The first group of welding points 114 is used for implementing an electrical connection between the primary-side wire and an external circuit, and the second group of welding points 115 is used for implementing an electrical connection between the secondary-side wire and the external circuit. The planner transformer is directly welded, by using the first group of welding points 114 and the second group of welding points 115, to an external circuit (for example, a power board in a switching power adapter) to which the planner transformer needs to be connected, with no need to weld a pin on a PCB.

In an embodiment of this application, the first group of welding points and the second group of welding points may be edge connector welding points. An edge connector includes a plurality of golden yellow conductive contact pieces and is referred to as "golden fingers" because its surface is plated with gold and the conductive contact pieces are arranged in a finger-like manner. The contact piece is formed by coating a copper-clad plate with a layer of highly conductive material (such as gold and brass) through a special process, to implement an electrical connection.

In addition, the first group of welding points 114 and the second group of welding points 115 each may include a plurality of welding points and a quantity of welding points that are specifically included is related to a specific structure of a winding in the planar transformer.

In an embodiment of this application, as shown in FIG. 3, a surface, of the PCB winding 110 is of an H shape. To be specific, two ends of the PCB winding 110 are of protrusion shapes. A height of a side on which the primary-side wire 112 of the PCB winding 110 is located and a height of a side on which the secondary-side wire 113 of the PCB winding 110 is located each are greater than a height of the winding body 111 in the middle of the PCB winding 110, and a difference between the height of the side on which the primary-side wire is located and the height of the side on which the secondary-side wire is located is greater than a height of the first magnetic core and a height of the second magnetic core. In this way, both sides of the PCB winding are of protrusion shapes. When a top part of the planar transformer is struck, a protrusion position on the PCB winding bears impact from an enclosure to prevent the magnetic cores from being broken and falling due to the impact.

In an embodiment of this application, the PCB winding is a single multilayer PCB. A winding is printed at each PCB layer, and there is an insulating medium (for example, a prepreg PP or a core board CORE) between any two PCB layers. The primary-side winding and the secondary-side winding each include a plurality of PCB layers. Insulation between primary-side windings, between secondary-side windings, and between a primary-side winding and a secondary-side winding is implemented by using the insulating medium between the PCB layers. Lead wires of a plurality of PCB layers forming the primary-side winding are connected in series to obtain the primary-side winding. Similarly, lead wires of a plurality of PCB layers forming the secondary-side winding are connected in series to obtain the secondary-side winding. The primary-side winding and the secondary-side winding are located at different PCB layers. Therefore, the primary-side wire and the secondary-side wire are located at different PCB layers.

The planar transformer provided in this embodiment includes the PCB winding and the two magnetic cores, and the two magnetic cores wrap the PCB winding to form a closed magnetic loop. The insulating cover wraps outside the two magnetic cores and the secondary-side wire, and the insulating cover can meet a requirement of enhancing insulation of the planar transformer. The first group of welding points is disposed on a primary-side wire side of the PCB winding, and the second group of welding points is disposed on a secondary-side wire side of the PCB winding. The planar transformer is directly welded to an external circuit board by using the first group of welding points and the second group of welding points. In this way, no pin needs to be welded on the PCB winding board. Therefore, a processing procedure for the planar transformer is simplified, full automatic processing is implemented, processing time and costs are reduced, and processing efficiency is improved. In addition, the planar transformer can be vertically installed on the external circuit board by using the first group of welding points and the second group of welding points. Compared with a horizontal planar transformer, the vertical installation mode requires less space on the external circuit board, thereby improving space utilization of the external circuit board.

An assembly process of the planar transformer provided in the embodiments of this application is described in detail below:

S1. Coat bonding adhesive on a surface (for example, a surface A) of the PCB winding 110 or in a position that is inside the second magnetic core 130 and that corresponds to the winding body.

S2. Fixedly connect the surface A of the PCB winding 110 to the second magnetic core 130 by using the bonding adhesive.

S3. Fixedly connect a grounding end of the PCB winding 110 to the second magnetic core 130 by using conductive adhesive, to implement grounded shield of the magnetic core.

S4. Solidify the bonding adhesive and the conductive adhesive by using a high-temperature reflux furnace.

S5. Coat the bonding adhesive on two side columns of the second magnetic core 130.

S6. Align the first magnetic core 120 and the second magnetic core 130 with each other and make them buckled and bonded to each other.

S7. Squeeze the two magnetic cores to reduce a thickness of the bonding adhesive between the two magnetic cores, to attach the two magnetic cores closely to each other.

S8. Solidify the bonding adhesive between the two magnetic cores by using the high-temperature reflux furnace.

S9. Install the insulating cover.

Figure 1:
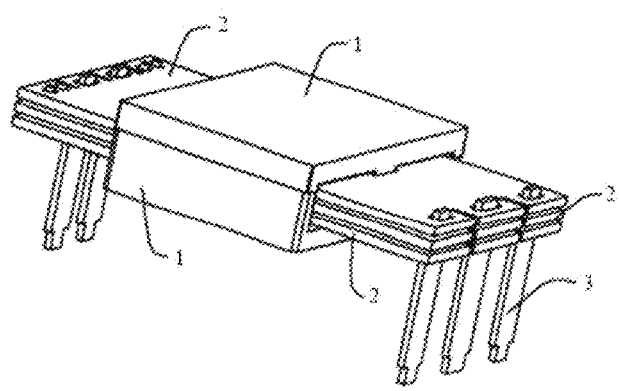
FIG. 1 is a schematic structural diagram of a conventional planar transformer.

FIG. 5 is an assembly effect diagram of the planar transformer assembled according to the foregoing assembly process. When the planar transformer is applied inside a switching power adapter, the planar transformer is installed onto a power board of the switching power adapter in a direction of an arrow shown in FIG. 5. It can be seen that a contact surface between the planar transformer and the power board is an area of a bottom surface of the planar transformer shown in FIG. 5, and the area is far smaller than a contact area (e.g., a surface, having a largest area, of the horizontal planar transformer shown in FIG. 1) between the planar transformer and the power board. Therefore, the planar transformer greatly improves space utilization of the power board.

On the planar transformer provided in the embodiments of this application, the magnetic cores and the PCB winding are fixedly connected by using the bonding adhesive and the conductive adhesive. In addition, a welding point is reserved for each of the primary-side wire and the secondary-side wire so that no pin needs to be welded on the PCB winding. In this way, the assembly process is simple and it is easy to implement automatic processing. In addition, the planar transformer can be vertically assembled on a power board by using two groups of welding points, improving space utilization of the power board.

According to another aspect, an embodiment of this application further provides a switching power adapter. The switching power adapter includes the planar transformer provided in any one of the foregoing embodiments, a power board, and another circuit component. The planar transformer is vertically assembled on the power board by using a first group of welding points and a second group of welding points, that is, a surface, e.g., having the largest area on the planar transformer, of the planar transformer is perpendicular to a surface, e.g., the surface having the largest area on the power board, of the power board. In this way, available space of the power board is conserved, improving space utilization of the power board and reducing a size of the switching power adapter.

It should be noted that the embodiments in this specification are described in a progressive manner. Each embodiment focuses on a feature different from other embodiments, and for same or similar parts in the embodiments, refer to these embodiments. An apparatus embodiment is similar to a method embodiment, and therefore is described relatively briefly. For related parts, refer to partial descriptions in the method embodiment.

What is claimed is:

1. A planar transformer, comprising: a printed circuit board (PCB) winding, an insulating cover, a first magnetic core, and a second magnetic core, wherein
   the PCB winding comprises a winding body, a primary-side wire, and a secondary-side wire, the winding body comprises a primary-side winding and a secondary-side winding, the primary-side wire is a lead wire of the primary-side winding, the secondary-side wire is a lead wire of the secondary-side winding, and a preset insulation distance is defined between the primary-side winding and the secondary-side wire;
   the first magnetic core and the second magnetic core wrap two sides of the winding body to form a closed magnetic loop;
   the insulating cover wraps outside the first magnetic core, the second magnetic core, and the secondary-side wire; and
   a first group of welding points electrically communicating with the primary-side winding is disposed at an end of the primary-side wire, a second group of welding points electrically communicating with the secondary-side winding is disposed at an end of the secondary-side wire, and the first group of welding points and the second group of welding points are used for connecting the planar transformer to an external circuit of the planar transformer.

2. The planar transformer according to claim 1, wherein a U-shaped groove on the PCB winding is disposed between the winding body and the secondary-side wire to increase an insulation distance between the secondary-side wire and each of the first magnetic core, the second magnetic core, and the primary-side winding.

3. The planar transformer according to claim 2, wherein an insulating sheet is disposed inside the insulating cover; a thickness of the insulating sheet matches a width of the U-shaped groove; and after the insulating cover is assembled, the insulating sheet fits in the U-shaped groove to increase the insulation distance between the primary-side winding and the secondary-side wire.

4. The planar transformer according to claim 1, wherein a through hole is disposed in a plane on which the winding body is located, bosses whose shapes match a shape of the through hole are disposed on sides, facing the winding body, of the first magnetic core and the second magnetic core, and the bosses of the first magnetic core and the second magnetic core align with each other and there is a preset air gap between the bosses; and
   two side columns are disposed facing the PCB winding, on sides of each of the first magnetic core and the second magnetic core, and the first magnetic core is in contact with the second magnetic core in a closed manner through the side columns.

5. The planar transformer according to claim 4, wherein on a surface of the PCB winding, lengths of sides on which the primary-side wire and the secondary-side wire are located each are greater than a length of the PCB winding body.

6. The planar transformer according to claim 4, wherein
   the first magnetic core or the second magnetic core is fixedly connected to the PCB winding by using bonding adhesive; and
   side columns of the second magnetic core are fixedly connected to those of the first magnetic core by using the bonding adhesive.

7. The planar transformer according to claim 1, wherein the first magnetic core is electrically connected to a ground point of the PCB winding by using conductive adhesive.

8. The planar transformer according to claim 1, wherein the PCB winding is a single multilayer PCB, there is an insulating medium between any two PCB layers of the single multilayer PCB, and any PCB layer is a primary-side winding or a secondary-side winding.

9. A switching power adapter, comprising a power board and the planar transformer according to claim 1, wherein
the first group of welding points and the second group of welding points of the planar transformer are directly welded on the power board, and a surface of the planar transformer is perpendicular to a surface of the power board.

* * * * *